United States Patent [19]

Onitsuka

[11] Patent Number: 5,501,004
[45] Date of Patent: Mar. 26, 1996

[54] OUTER-LEAD BONDING APPARATUS AND METHOD THEREFOR

[75] Inventor: Yasuto Onitsuka, Fukuoka, Japan

[73] Assignee: Matsushita Electric Industrial Co., Ltd., Osaka, Japan

[21] Appl. No.: 299,766

[22] Filed: Sep. 1, 1994

[30] Foreign Application Priority Data

Sep. 6, 1993 [JP] Japan .................................. 5-221079

[51] Int. Cl.$^6$ ............................. H01R 43/06; B23P 19/00
[52] U.S. Cl. .................. 29/827; 29/739; 29/759; 228/180.21
[58] Field of Search ................. 228/180.21; 29/759, 29/827, 739

[56] References Cited

U.S. PATENT DOCUMENTS

| | | | |
|---|---|---|---|
| 3,774,834 | 11/1973 | Holler et al. | ........................... 29/827 X |
| 3,949,925 | 4/1976 | Keizer et al. | ........................... 29/827 X |
| 4,967,261 | 10/1990 | Niki et al. | ........................... 29/827 X |
| 5,177,596 | 1/1993 | Muramatsu et al. | |
| 5,276,961 | 1/1994 | Matta et al. | ........................... 29/827 |

FOREIGN PATENT DOCUMENTS

| | | | |
|---|---|---|---|
| 3-286599 | 12/1991 | Japan | ........................... 29/739 |
| 4302200 | 10/1992 | Japan . | |

*Primary Examiner*—Carl J. Arbes
*Attorney, Agent, or Firm*—Panitch Schwarze Jacobs & Nadel

[57] ABSTRACT

An outer lead bonding apparatus and method bonds an outer lead of a tape carrier package to an electrode formed on a display panel. During the observation stage when positional deviations between the outer lead and electrode are detected and corrected, a pressing member presses on the outer lead to remove any warp or bend in the outer lead. The electrode includes anisotropic conductive tape which is inherently adhesive. To prevent unwanted movement of the tape carrier package during the observation and positioning process by premature sticking of the outer lead to the tape on the electrode, the tape carrier package is sandwiched firmly in place.

6 Claims, 13 Drawing Sheets

“5,501,004”

OUTER-LEAD BONDING APPARATUS AND METHOD THEREFOR

FIELD OF THE INVENTION AND RELATED ART STATEMENT

1. Field of the Invention

The present invention relates to an apparatus and a method for bonding an outer lead of a device to an electrode of a display panel.

2. Description of the Related Art

As a display panel for electronics, a liquid crystal panel or a plasma display panel has been known in the art. Generally, such display panel is assembled by bonding an outer lead of a device driver to an electrode provided at an end part of an under plate made of a glass board etc. A generally-used driver is a Tape Carrier Package (hereinafter is referred to as TCP) which is made by the TAB (Tape Automated Bonding) method.

In this TAB method, a lead made of a conductive material is formed on a surface of a film carrier. Next, a chip cut out of a wafer is bonded on the lead. Finally, a TCP is obtained by removing out an outer lead part of the lead with a punching machine. The above-mentioned film carrier is made of an extremely thin synthetic resin film such as polyimide.

For example, an outer lead bonding apparatus for bonding an outer lead of the TCP to a display panel is disclosed in an Unexamined Japanese patent publication Tokkai (Hei) 4-302200. In this apparatus, the outer lead of the TCP is put on an electrode of the display panel to temporarily position with each other. In this state, observation of the electrode and the outer lead is carried out to detect a relative positional deviation from each other. Next, the TCP is horizontally moved in X-direction, Y-direction and θ-direction (rotational direction) with respect to the display panel, thereby canceling the positional deviation. After that, the outer lead is bonded on the electrode.

However, the above-mentioned conventional outer-lead bonding method has the following shortcomings:

(1) Since the outer lead is extremely fine and weak, it easily causes deformation. Further, the film carrier is often bent. Therefore, warp or bend of the outer lead can not be corrected by merely putting the outer lead on the electrode. Therefore, it is impossible to precisely detect the relative positional deviation between the two. Thus, a fine-positioned bonding cannot be realized.

(2) Generally, anisotropic conductive adhesive tape is provided on the electrode of the display panel or under the outer lead. When the aforementioned temporary positioning is carried out, there often occurs an undesirable situation that the anisotropic conductive adhesive tape gets stuck to the outer lead warped downward. As a result, it becomes difficult to correct the positional deviation by moving the TCP relatively in the horizontal direction with respect to the display panel.

OBJECT AND SUMMARY OF THE INVENTION

An object of the present invention is to offer a method and an apparatus for bonding the outer lead of a device to the electrode of a mother substrate with high preciseness of the positioning.

In order to achieve the above-mentioned object, an outer-lead bonding apparatus of the present invention comprises:

holding means for holding thereon a substrate on which an electrode is formed;

feeding means for feeding a tape carrier package to a position where an outer lead of the tape carrier package is to be disposed on the electrode;

pressing means for pressing an outer lead of the tape carrier package onto the electrode;

bonding means for bonding the outer lead to the electrode; and observation means for observing the electrode and the outer lead, the observation means being disposed under a position where the outer lead is bonded to the electrode.

In another aspect, the present invention is an outer-lead bonding method comprises the steps of:

locating an outer lead of a tape carrier package above an electrode of a display panel;

lowering a pressing member and slightly pressing the outer lead on the electrode;

detecting a positional deviation between the outer lead and the electrode;

relatively moving the tape carrier package from the electrode to correct the positional deviation; and lowering a compression member and bonding the outer lead onto the electrode.

According to the present invention, a positional deviation between the outer lead and the electrode can be detected correctly. Therefore, correction of the deviation is carried out with a very fine preciseness, and it is possible to precisely bond the outer lead to the display panel.

While the novel features of the invention are set forth particularly in the appended claims, the invention, both as to organization and content, will be better understood and appreciated, along with other objects and features thereof, from the following detailed description taken in conjunction with the drawings.

It will be recognized that some or all of the Figures are schematic representations for purposes of illustration and do not necessarily depict the actual relative sizes or locations of the elements shown.

DESCRIPTION OF THE PREFERRED EMBODIMENT

Hereafter, a preferred embodiment will be described with reference to the accompanying drawings.

Figure 1:
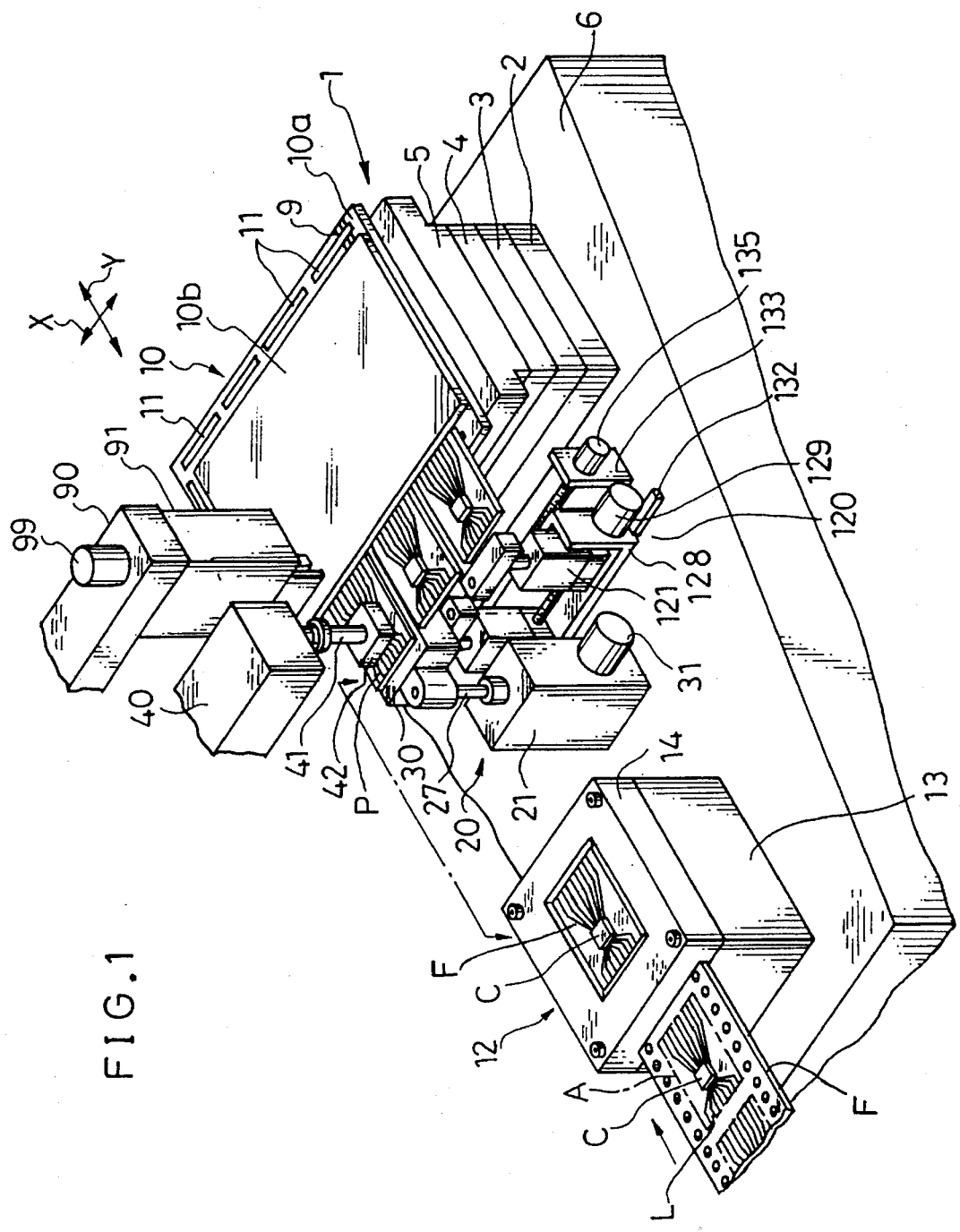
FIG. 1 is a perspective view showing an entire configuration of an outer-lead bonding apparatus in the present invention.

FIG. 1 is a perspective view showing an entire configuration of an outer-lead bonding apparatus. A moving unit 1, which is provided on a base stand 6, horizontally moves a display panel 10 in X-, Y- and θ-directions. Amount of moving in the θ direction is expressed by an angle θ on an X-Y plane measured from a selected axis of coordinates. The moving unit 1 includes an X-table 2, a Y-table 3, a θ-table (turn table) 4 and a top table 5. The X-table 2 is slidably mounted on the base stand 6. The Y-table 3 is slidably mounted on the X-table 2, and the θ-table 4 is rotatably mounted on the Y-table 3. The top table 5 is fixedly mounted on the θ-table 4. The display panel 10 is mounted on the top table 5.

The display panel 10 is constituted by bonding a bottom plate 10a and a top plate 10b with each other. The display panel 10 is typically a liquid crystal panel. Plural electrodes 9 aligned with a short interval between adjacent two of them are formed on three side end portions of the bottom plate 10a. Anisotropic conductive tapes 11 are stuck on the electrodes 9.

Figure 2:
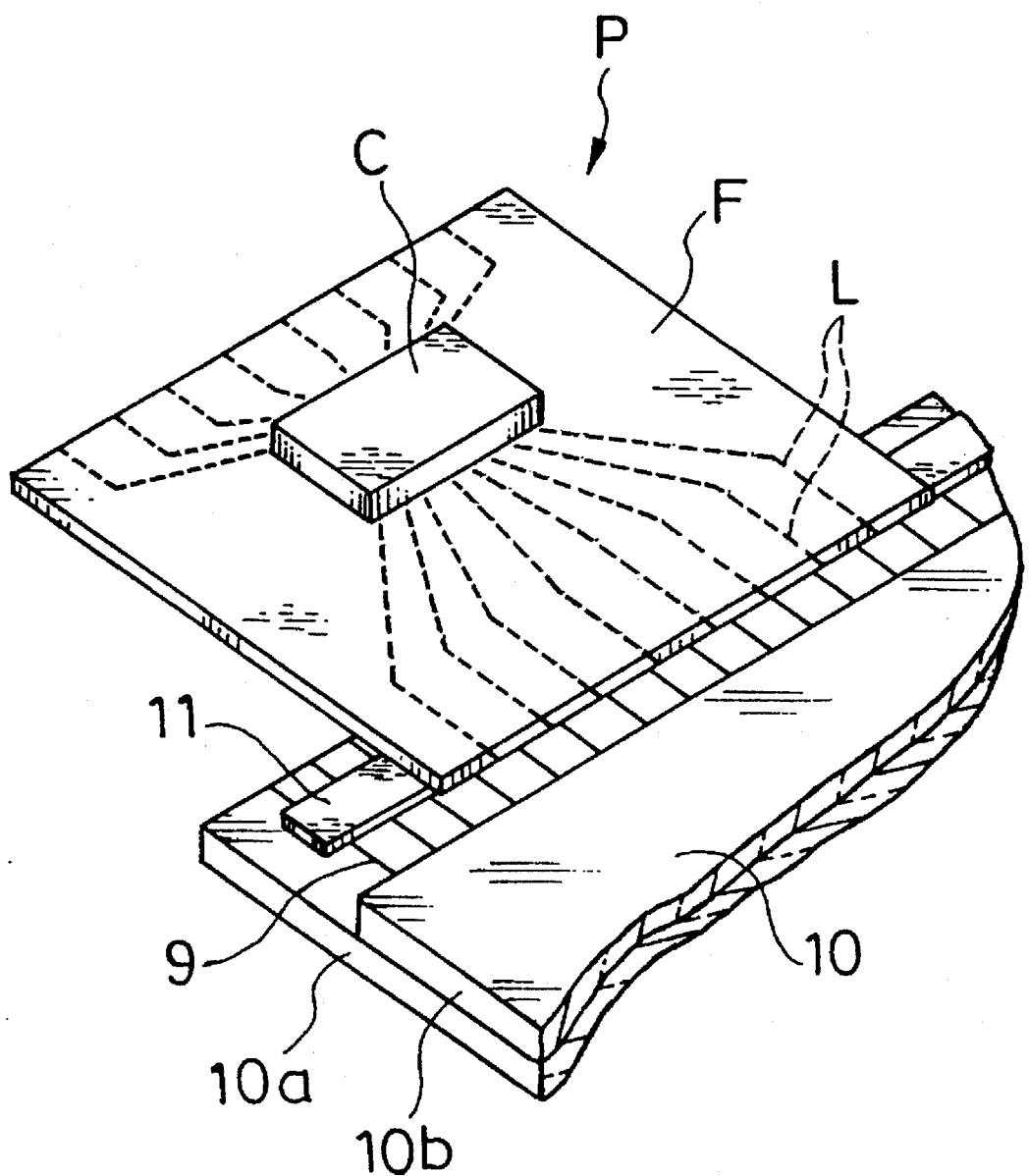
FIG. 2 is an enlarged perspective view showing parts to be bonded by the outer-lead bonding apparatus shown in FIG. 1.

FIG. 2 is an enlarged perspective view showing parts to be bonded by the outer lead bonding apparatus shown in FIG. 1. As shown in FIG. 2, a TCP (Tape Carrier Package) P, which is made by the TAB (Tape Automated Bonding) method, has a film F, a chip C cut out of a wafer (not shown) and bonded on the film F and plural outer leads L formed (i.e., stuck) on the film F with a minute interval between adjacent two of them. Although the anisotropic conductive tape 11 is stuck on the electrodes 9 in the above-mentioned description, the tape 11 may be stuck on a bottom face of the TCP P.

Figure 3:
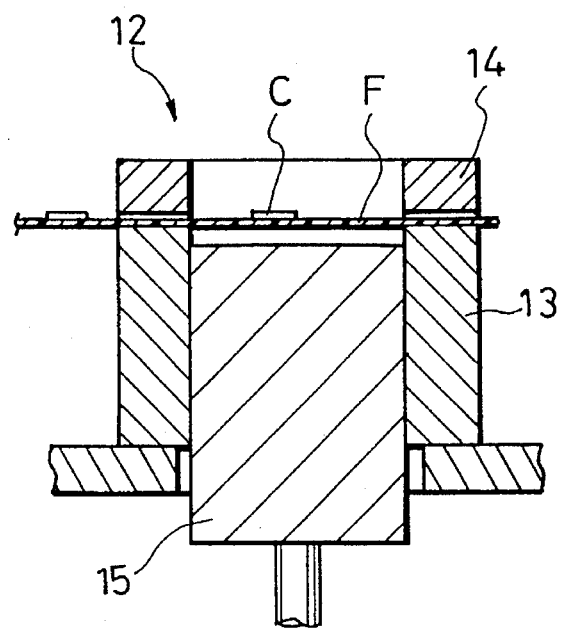
FIG. 3 is a cross-sectional view showing a punching machine 12 shown in FIG. 1 in a state of before the punching.
Figure 4:
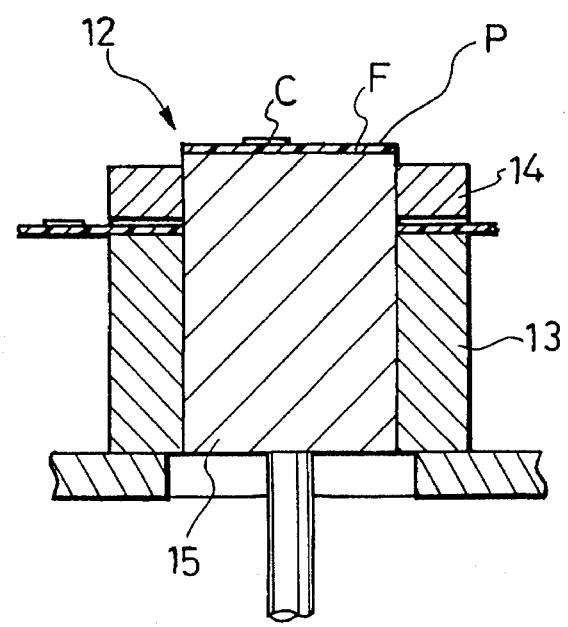
FIG. 4 is a cross-sectional view showing the punching machine 12 shown in FIG. 1 in a state of after the punching.

In FIG. 1, a punching machine 12 is provided on a side part of the base stand 6. FIG. 3 and FIG. 4 are cross-sectional views showing the punching machine 12 in states of before and after punching, respectively. The punching machine 12 mainly consists of a lower housing 13, an upper housing 14 and a punch 15. When a predetermined length of the film F on which the chip C is mounted is forwarded onto the lower housing 13 as shown in FIG. 3, the punch 15 rises and stamps out a device P from the continuous film F as shown in FIG. 4. In FIG. 1, a chain line "A" shows a stamping-out line by the punch 15.

Figure 5:
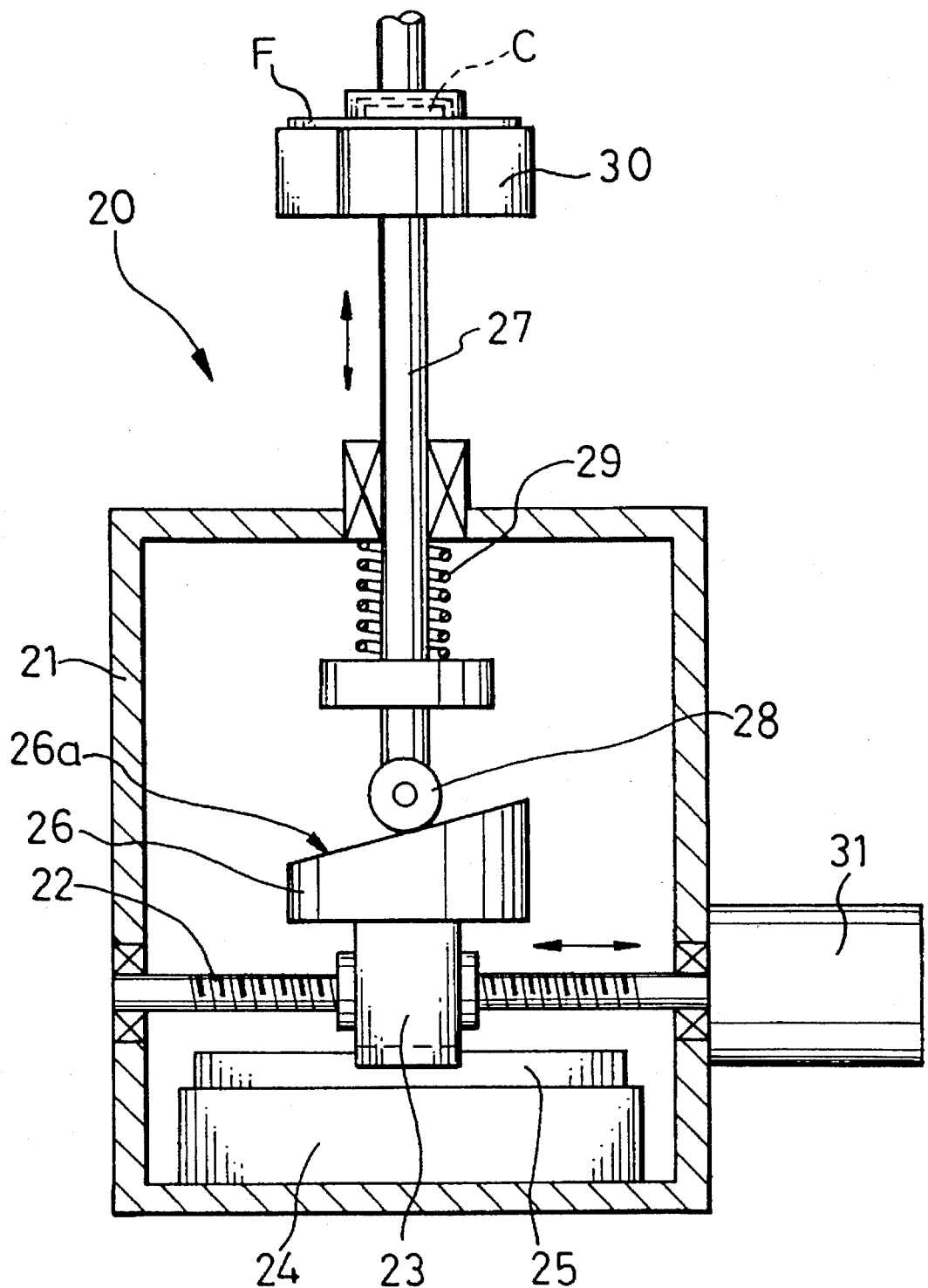
FIG. 5 is a cross-sectional view showing a lifting unit 20 shown in FIG. 1.

In FIG. 1, between the moving unit 1 and the punching machine 12, a lifting unit 20 is provided for lifting up or lowering the device P. FIG. 5 is a cross-sectional view showing the lifting unit 20. In FIG. 5, a ball screw 22 is horizontally held by a lower part of a box 21. A nut 23 is engaged with the ball screw 22. A bottom part of the nut 23 makes slidable engagement with a guide rail 25 formed on a base member 24.

A plate cam 26 is mounted on a top face of the nut 23. A rod 27 is vertically mounted to the box 21. A roller 28 is provided at a lower end of the rod 27. The roller 28 always makes contact with a slanted face 26a of the plate cam 26 with a force acting downward that is given by a spring 29. A table 30 is provided at a top end of the rod 27. A motor 31 provided on an outer face of the box 21 is linked with the ball screw 22. When the motor 31 makes normal rotation, the nut 23 and the plate cam 26 move leftward in the figure. The roller 28 is thereby raised along the slanted face 26a. Thus, the table 30 rises in response to normal rotation of the motor 31. When the motor 31 makes reverse rotation, the nut 23 and the plate cam 26 move rightward. As a result, the roller 28, which is urged by the spring 29 to go downward, is lowered to keep contact with the slanted face 26a. Thus, the table 30 lowers in response to reverse rotation of the motor 31.

Figure 10:
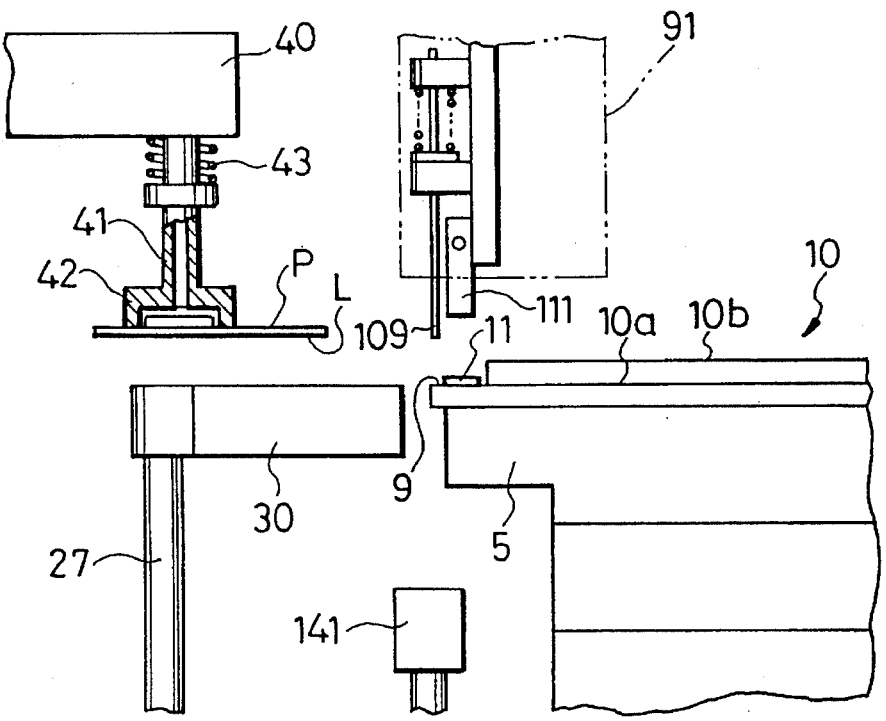
FIG. 10 is a side view showing a first stage of a bonding process in the outer-lead bonding apparatus shown in FIG. 1.

In FIG. 1, a loading head 40 has a nozzle shaft 41 projected downward. At a lower end of the nozzle shaft 41, a collect-type nozzle 42 is provided. The loading head 40 moves by a drive unit (201 in FIG. 17) in the X-direction and the Y-direction within a space between the punching machine 12 and the table 5. Drive means (not shown) for driving the nozzle shaft 41 up and down and a motor (not shown) for making θ-rotation of the nozzle shaft 41 around its axis are provided in the loading head 40. In FIG. 10, a detailed constitution of the nozzle shaft 41 etc. is shown. As shown in the figure, the nozzle shaft 41 is urged by a coil spring 43 to go downward.

Figure 6:
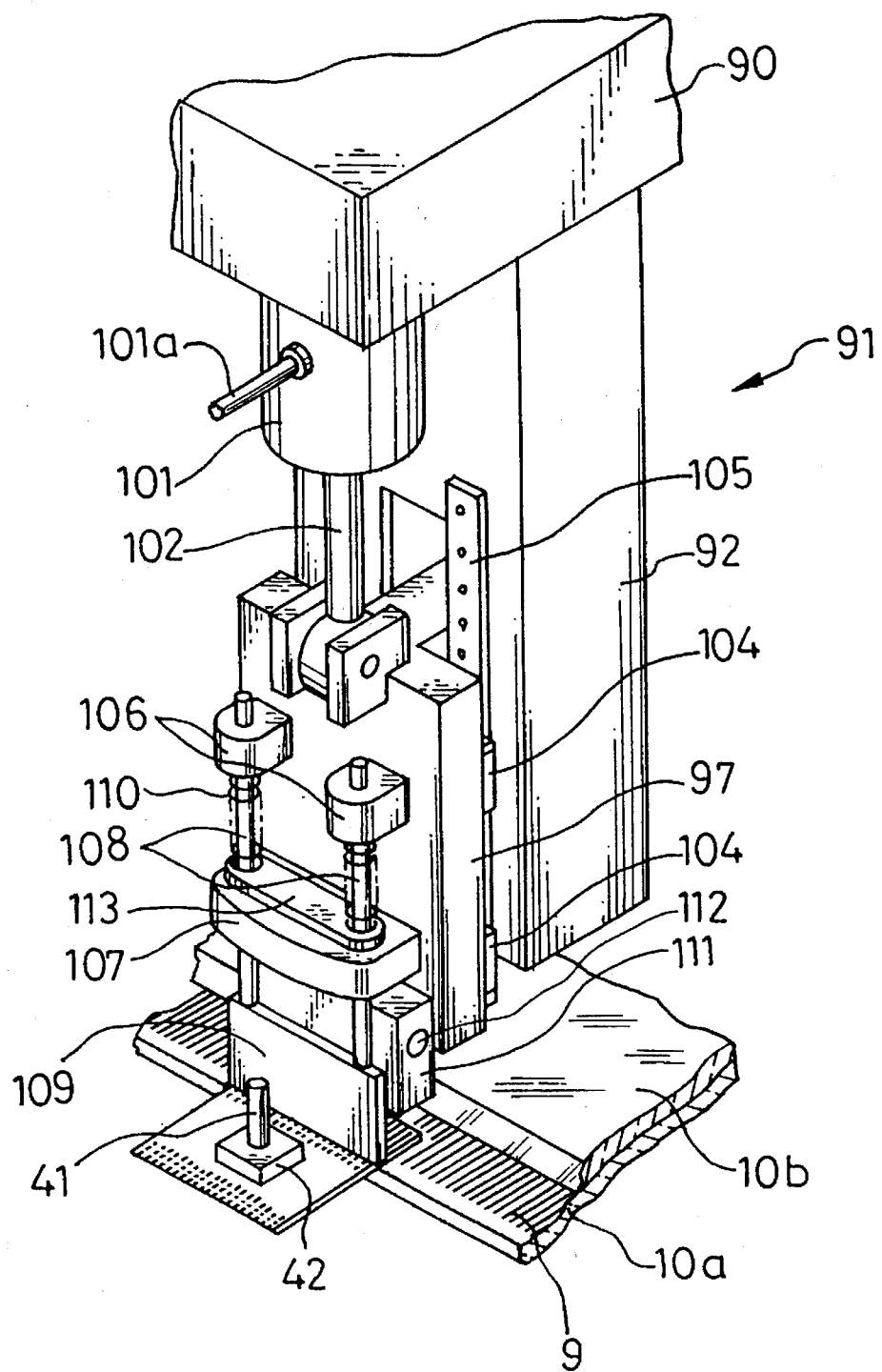
FIG. 6 is a perspective view showing a bonding head 91 shown in FIG. 1.
Figure 7:
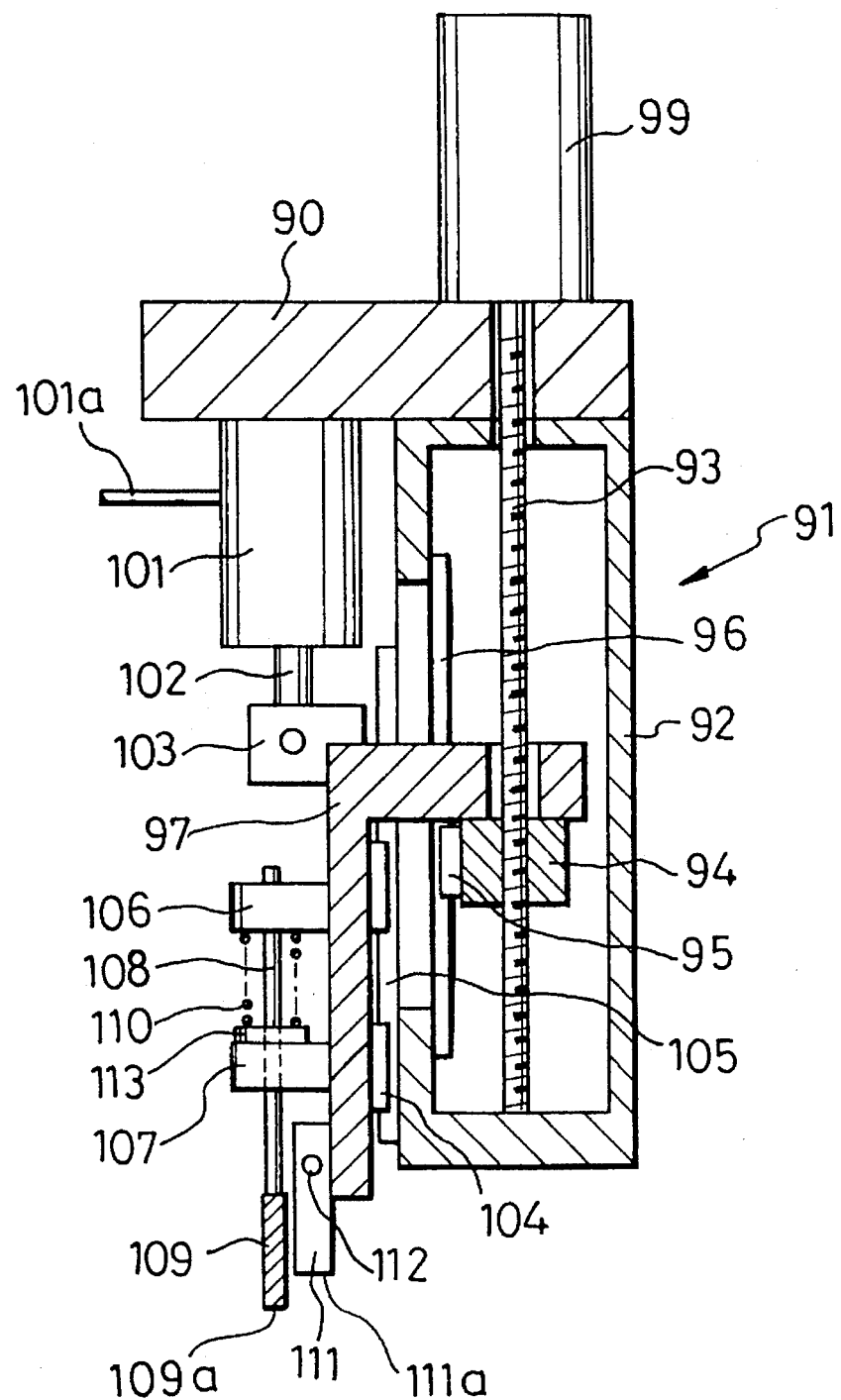
FIG. 7 is a cross-sectional view showing the bonding head 91 shown in FIG. 1.

In FIG. 1, a bonding head 91 is fixed to a holding frame 90. Next, constitution of the bonding head 91 is described. FIG. 6 and FIG. 7 are a perspective view and a cross-sectional view each showing the bonding head 91. In FIG. 7, the bonding head 91 has a case 92, a ball screw 93 vertically mounted in the case 92 and a nut 94 engaged with the ball screw 93. A slider 95 integrally formed on the nut 94 slides along a guide rail 96 which is vertically mounted on an inner face of the case 92. An L-shaped bracket 97 is linked with the ball screw 93. The case 92 is fixed to the frame 90 at a top end face of the case 92. A motor 99, which is connected with the ball screw 93, is mounted on a top face of the frame 90. When the motor 99 and hence the ball screw 93 rotate, the nut 94 rises along the ball screw 93. A cylinder 101 is fixed to a bottom face of the frame 90, and a rod 102 of the cylinder 101 is connected to a shoulder part of the bracket 97 via a connecting member 103.

A slider 104 is fixed on an inner face of the bracket 97. The slider 104 is engaged with a guide rail 105 vertically mounted on an outer face of the case 92. A pair of flanges 106 and a flange 107 are formed on a front face of the bracket 97, and a pair of rods 108 are inserted into the flanges 106 and 107. A rectangular plate-shaped pressing member 109 is fixed to lower ends of the rods 108. A thermo-compression bonding tool member 111 is fixed on a front lower end part of the bracket 97. As shown in FIG. 7, a bottom face 111a of the thermo-compression bonding tool member 111 is disposed at a vertical position slightly higher than that of a bottom face 109a of the pressing member 109. A cartridge heater 112, which is mounted in the thermo-compression bonding tool member 111, heats the thermo-compression bonding tool member 111 up to approximately 110° C. The pressing member 109 acts to temporarily hold the outer lead L (FIG. 2) on the electrode 9 (FIG. 2) of the display panel 10 (FIG. 2) and flatten out warp or bend in the outer lead L of the TCP P (FIG. 2). Although in this embodiment the pressing member 109 is provided in the bonding head 91, it alternatively can be provided in the loading head 40.

As shown in FIG. 6, both the two rods 108 are associated with each other via a plate 113 which defines a lowering limit of the pressing member 109. The plate 113 is urged by coil springs 110 each mounted around the rod 108, thereby being pressed onto an upper face of the flange 107.

In FIGS. 6 and 7, the cylinder 101 always presses the bracket 97 onto the nut 94 with a predetermined bonding pressure. Accordingly, the cylinder 101 acts as means for loading the member 111 with the bonding pressure. The bonding pressure is controllable by varying pressure supplied to the cylinder 101. The motor 99, the ball screw 93 and the nut 94 constitute up and down assembly for raising and lowering the thermo-compression bonding tool member 111, and this up and down assembly adjusts a lowering speed and a height of the thermo-compression bonding tool member 111.

Figure 8:
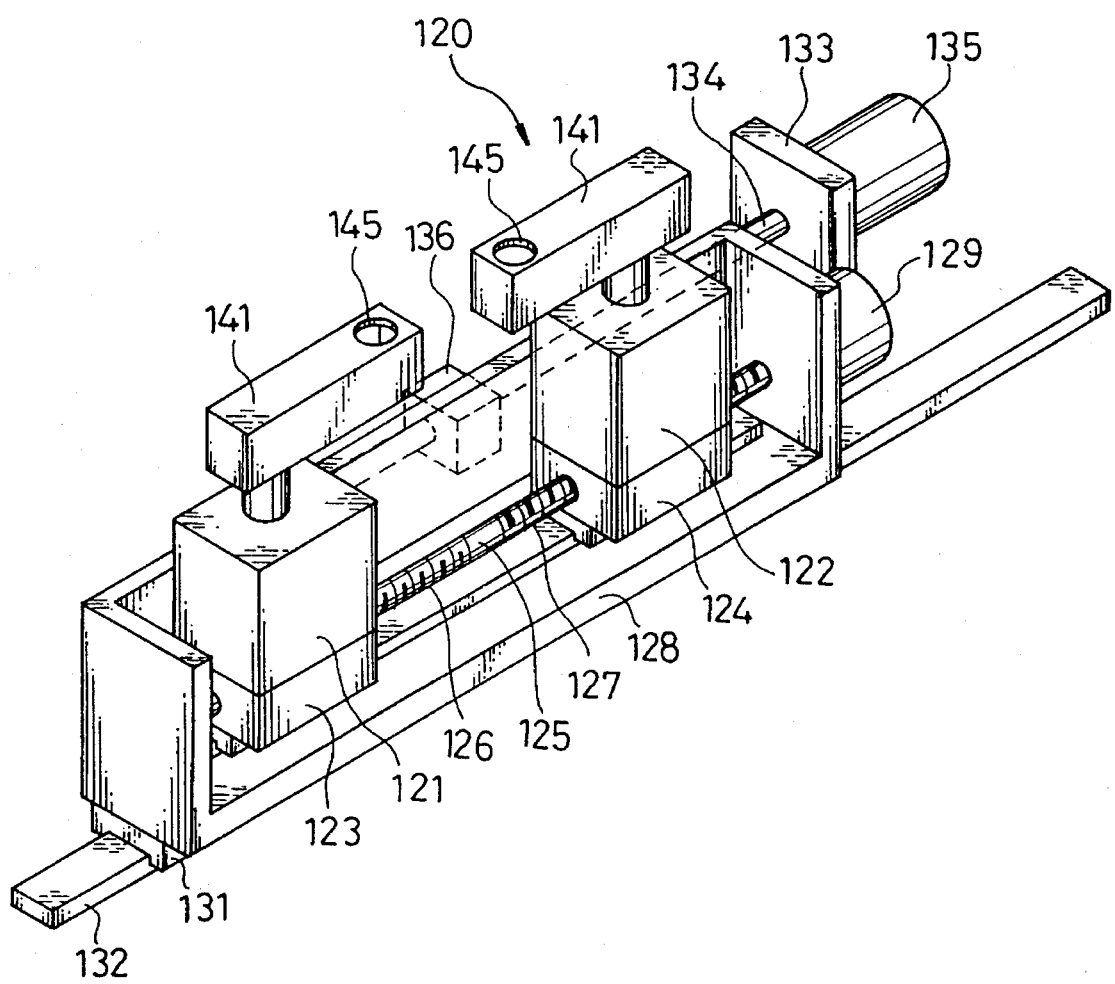
FIG. 8 is a perspective view showing an observation unit 120 shown in FIG. 1.
Figure 9:
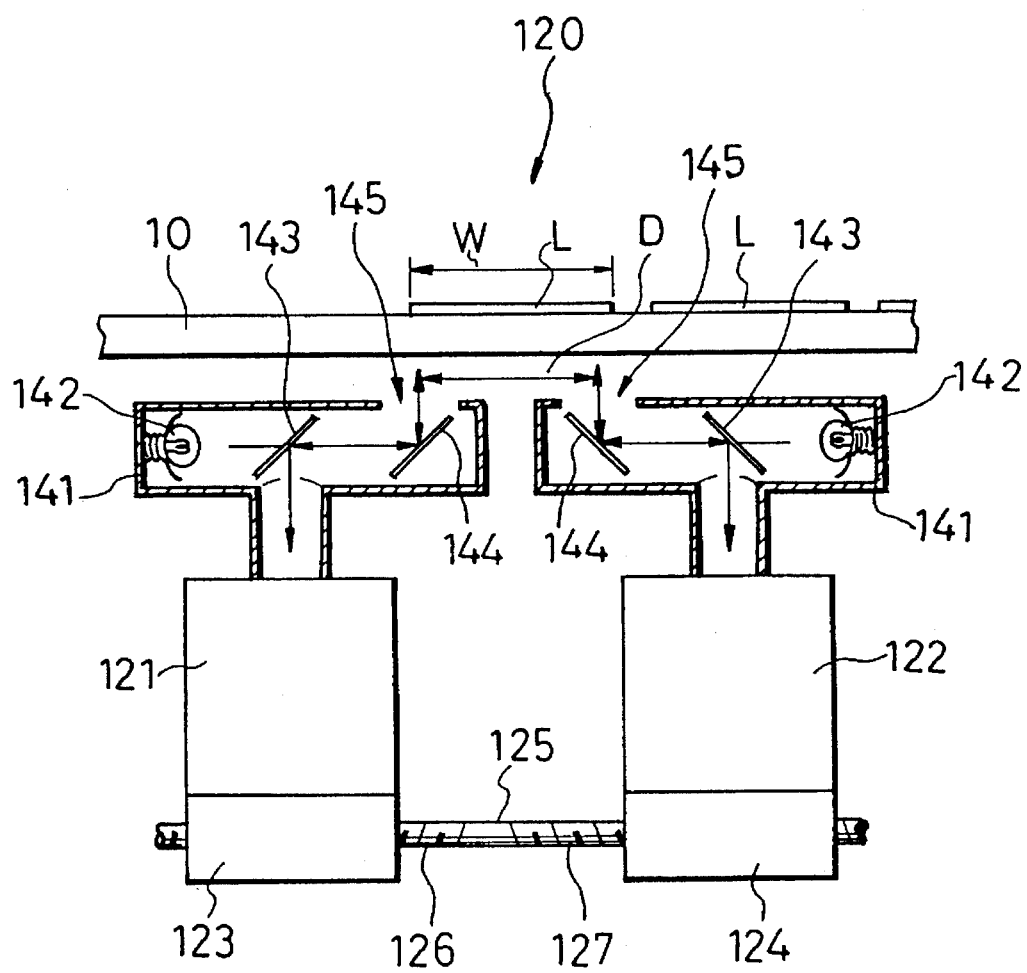
FIG. 9 is a cross-sectional view showing a main configuration of the observation unit 120 shown in FIG. 1.

In FIG. 1, an observation unit 120 is provided under the bonding position between the lifting unit 20 and the moving unit 1. FIG. 8 is a perspective view showing the observation unit 120, and FIG. 9 is a cross-sectional view showing a main configuration of the observation unit 120. A first camera 121 and a second camera 122 are mounted on a first nut 123 and a second nut 124, respectively. A ball screw 125 for driving the nuts 123 and 124 in the X-direction (FIG. 1) is inserted in the nuts 123 and 124. The ball screw 125 has a right-hand thread 126 and a left-hand thread 127. The first nut 123 is engaged with the right-hand thread 126, and the second nut 124 is engaged with the left-hand thread 127. The ball screw 125 is held by a first frame 128. A motor 129 for revolving the ball screw 125 is provided at a side wall part of the frame 128. When the motor 129 is driven, the ball screw 125 revolves through the nuts 123 and 124. The first camera 121 and the second camera 122 move along the ball screw 125 in reverse directions to each other, thereby widening or narrowing a distance between the first camera 121 and the second camera 122. Therefore, the distance between the cameras 121 and 122 can be adjusted by controlling an amount of rotation and a direction of rotation in the motor 129. The nuts 123, 124, the ball screw 125 and the motor 129 constitute an assembly for adjusting the distance between the first camera 121 and the second camera 122.

A slider 131, which is fixedly provided under the first frame 128, is engaged with a guide rail 132 extended in the X-direction on the base stand 6 (FIG. 1). A second frame 133 is provided behind the first frame 128. A ball screw 134 for the X-direction is held by the second frame 133. A motor 135 for revolving the ball screw 134 is provided at a side wall part of the second frame 133. The ball screw 134 is engaged with a nut 136 which is provided on a rear face of the first frame 128. When the motor 135 is driven to revolve the ball screw 134, the first frame 128 moves in the X-direction along the guide rail 132. Thus, observing positions of the first camera 121 and the second camera 122 are adjusted by moving the first frame 128 in the X-direction.

A lens-barrel 141 extended in the X-direction is provided above each of the first camera 121 and the second camera 122. As shown in FIG. 9, a light source 142, a half mirror 143 and a mirror 144 are mounted in the lens-barrel 141. A window 145 is formed above the mirror 144. Through the window 145, the electrode 9 (FIG. 2) of the display panel 10 and the outer lead L of the TCP P are observed. When the motor 135 is driven to move the first frame 128 in the X-direction, each of the cameras 121 and 122 comes to a position under the outer lead L of the TCP P which is being sucked by the nozzle 42. In FIG. 9, a width W of the outer lead L is not constant but is dependent on a kind of the TCP P. In accordance with the width W, the motor 129 is driven to move the first camera 121 and the second camera 122 in reverse directions to each other along the ball screw 125. A distance D between both the windows 145 is thus adjusted so that both the windows 145 will be disposed under both ends of the outer lead L, respectively.

Figure 17:
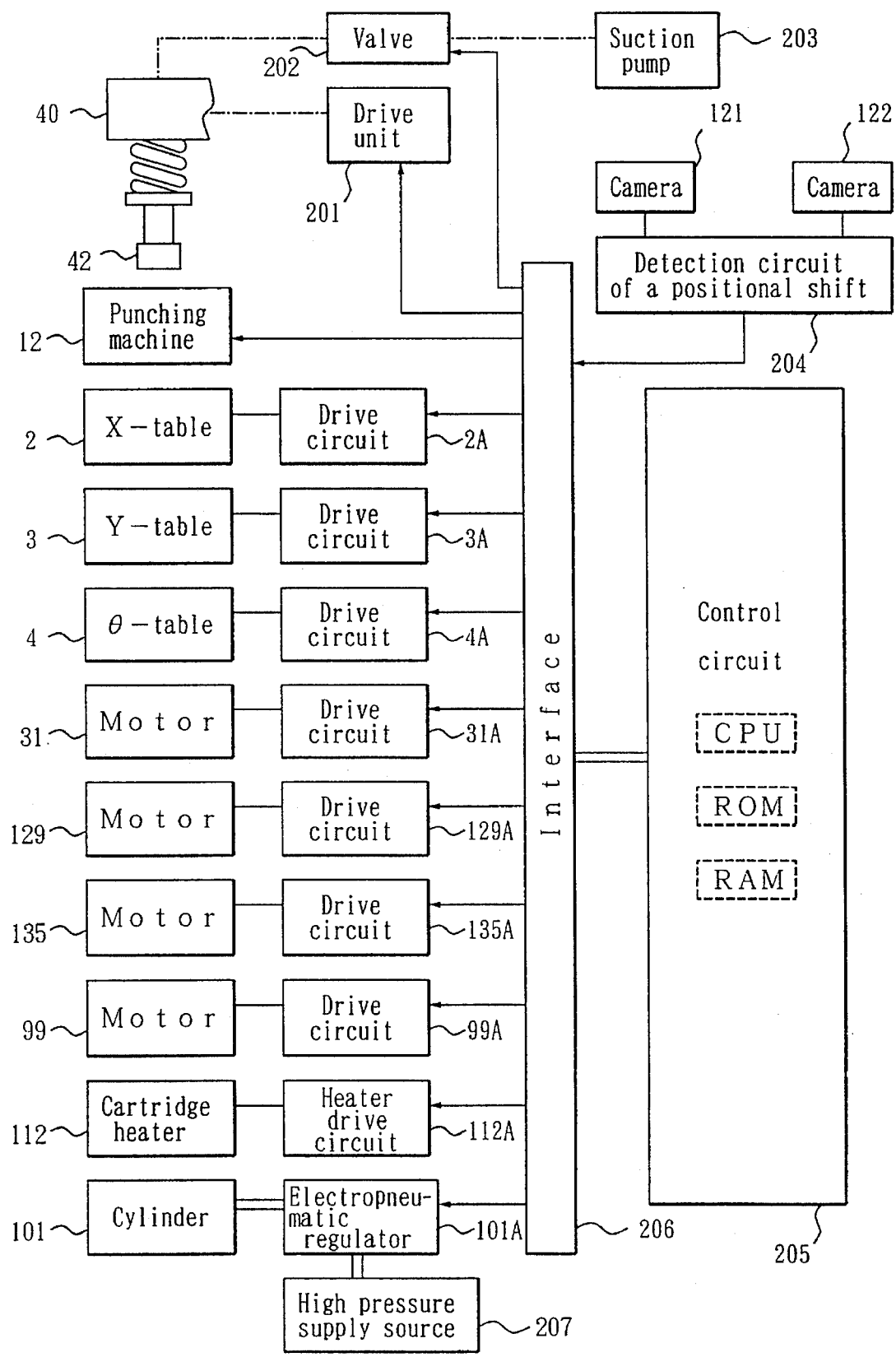
FIG. 17 is a block diagram showing an entire control system of the outer-lead bonding apparatus shown in FIG. 1.

FIG. 17 is a block diagram showing an entire control system of the outer-lead bonding apparatus. In FIG. 17, a valve 202 for actuating the nozzle 42 to suck or release is connected to a control circuit 205 via an interface 208. A suction pump 203 is connected to the valve 202. A drive unit 201, which is for moving the loading head 40, and the punching machine 12 are also connected to the control circuit 205 via the interface 208. The X-table 2, the Y-table 3, the θ-table 4 and the motors 31, 129, 135, 99 are connected to respective drive circuits 2A, 3A, 4A, 31A, 129A, 135A and 99A, and each of these drive circuits 2A, 3A, 4A, 31A, 129A, 135A and 99A is connected to the control circuit 205 via the interface 206. A cartridge heater 112 and a cylinder 101 are connected to a heater drive circuit 112A and an electropneumatic regulator 101A, respectively. The heater drive circuit 112A and the electropneumatic regulator 101A are connected to the control circuit 205 via the interface 206. A high pressure supply source 207 is connected to the electropneumatic regulator 101A to supply the cylinder 101 with a high pressure air. The cameras 121 and 122 are connected to a detection circuit 204 of a positional deviation, and the detection circuit 204 is connected to the control circuit 205 via the interface 206. The control circuit 205 includes a CPU, a ROM and a RAM.

Figure 18:
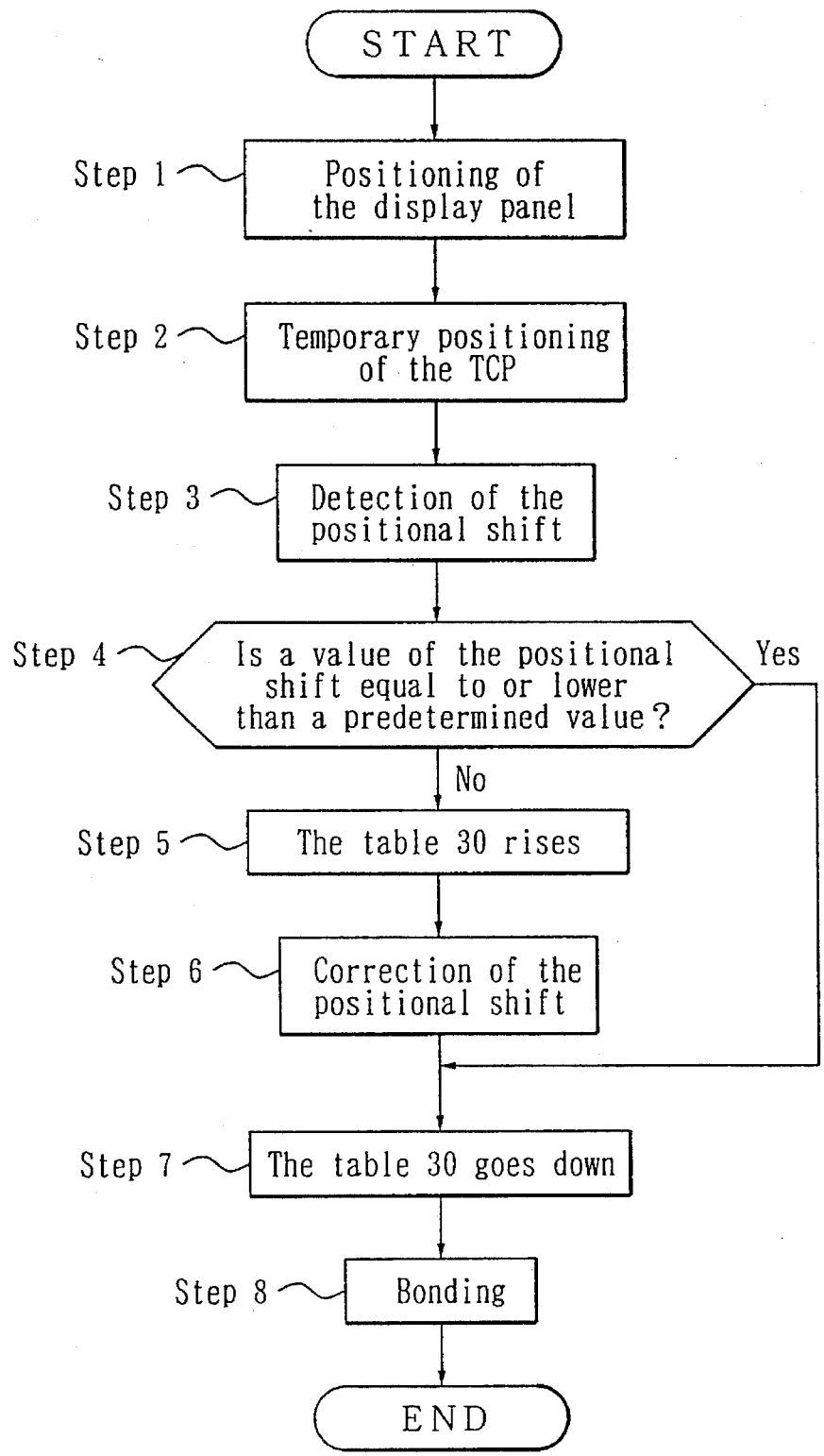
FIG. 18 is a flow chart which is executed in a control circuit 205 shown in FIG. 17.

FIG. 18 is a flow chart of an operation which is executed in the control circuit 205.

Next, operation of the above-mentioned outer-lead bonding apparatus will be described.

At first, in FIG. 1, the display panel 10 is carried onto the top table 5 by means of a carrying apparatus (not shown). The top table 5 has therein holding means such as a vacuum suction equipment, and the display panel 10 is thereby sucked and held on the table 5.

[Step 1]

Next, at a step 1 in FIG. 18, the control circuit 205 (FIG. 17) executes the positioning of the display panel 10 by driving the X-table 2 and the Y-table 3 shown in FIG. 1. The electrode 9, which is provided at a longitudinal side part of the display panel, is thereby moved to a visual field of the first camera 121 and the second camera 122 of the observation unit 120. Thus, the lens-barrels 141 are disposed under the electrode 9 as shown in FIG. 10.

[Step 2]

At a step 2 in FIG. 18, the control circuit 205 (FIG. 17) executes the temporary positioning of the TCP P. In FIG. 1, the loading head 40 goes to a position above the punching machine 12. The nozzle shaft 41 lowers to suck the TCP P put on the punch 15 (FIG. 4), and thereafter the nozzle shaft 41 rises and goes to a position above the table 30. Next, the TCP P is lowered onto an upper face of the table 30. The TCP P is sandwiched by the table 30 and the nozzle 42. An adjustment is carried out beforehand so that a height of an upper face of the table 30 will be made nearly equal to that of the electrode 9 of the display panel 1.

[Step 3]

Figure 11:
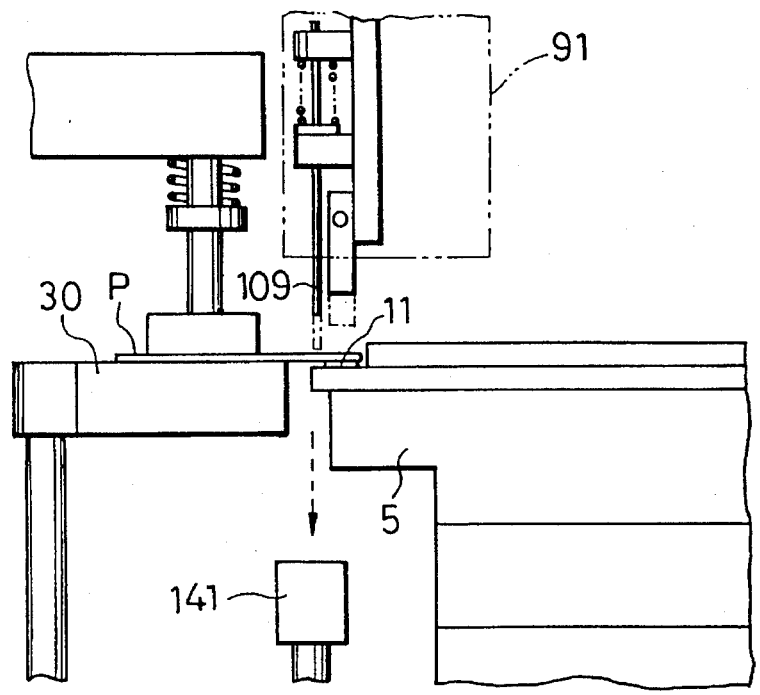
FIG. 11 is a side view showing a second stage of the bonding process in the outer-lead bonding apparatus shown in FIG. 1.

At a step 3 in FIG. 18, the control circuit 205 (FIG. 17) executes the detection of the positional deviation. As shown in FIG. 11, the pressing member 109 is lowered to slightly press the outer lead L onto the anisotropic conductive tape 11. In this state, the electrode 9 and the outer lead L are observed by the first camera 121 and the second camera 122. Thus, by slightly pressing the outer lead L to the anisotropic conductive tape 11 with the pressing member 109, warp or bend of the outer lead L is removed. Therefore, it is possible to correctly detect a positional deviation of the outer lead L with respect to the electrode 9.

Figure 14:
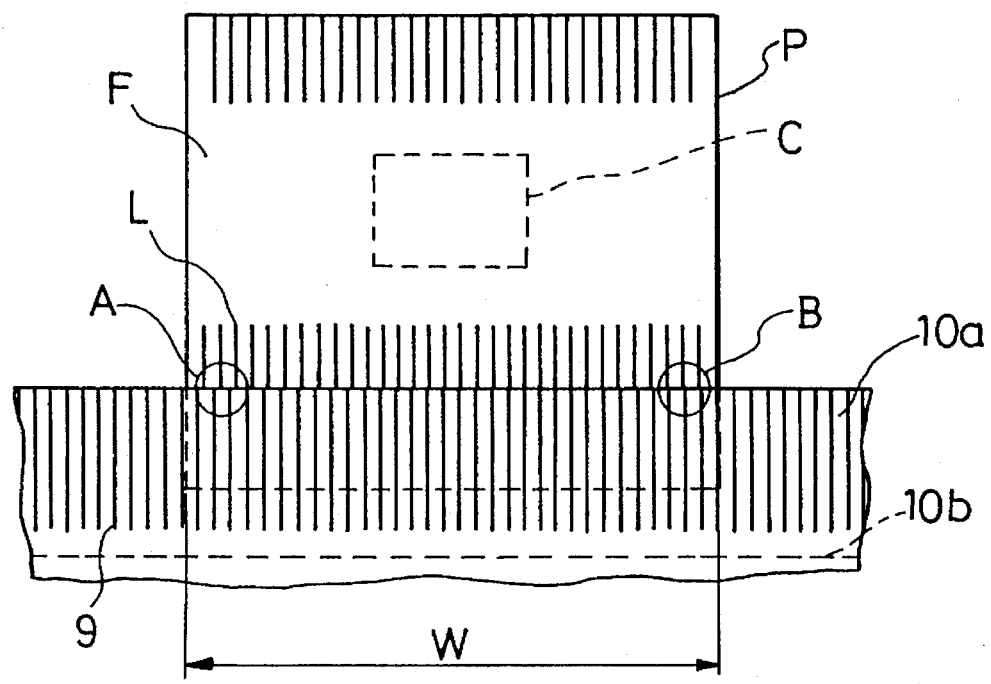
FIG. 14 is a bottom view showing a TCP P and an electrode 9 in the outer-lead bonding apparatus shown in FIG. 1.
Figure 15:
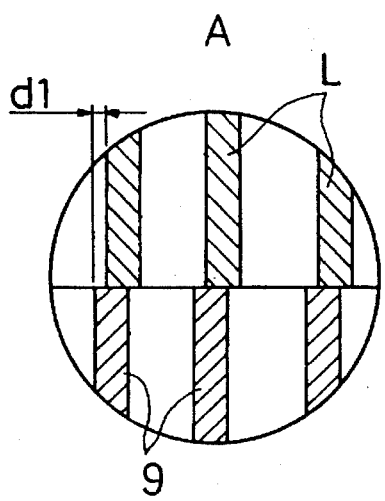
FIG. 15 is an enlarged view of "A" shown in FIG. 14.
Figure 16:
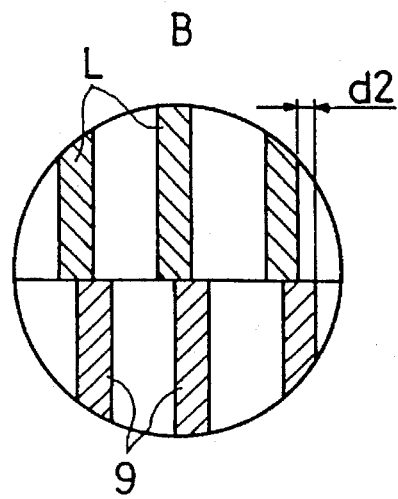
FIG. 16 is an enlarged view of "B" shown in FIG. 14.

FIG. 14 is a bottom view showing the TCP P and the electrode 9 which is observed by the cameras 121 and 122. A left end part of the outer lead L is taken into a visual field A of the first camera 121, and a right end part of the outer lead L is taken into a visual field B of the second camera 122. FIG. 15 and FIG. 16 are partially enlarged views showing the visual field A and B, respectively. Based on these views, positional deviations in X-, Y- and θ-directions of the outer lead L and the electrode 9 are detected.

For instance, the above-mentioned "positional deviation" is specified as the following value:

As shown in FIG. 14, an interval of adjacent two outer leads L is slightly shorter than that of the electrodes 9. This is because it is necessary to consider the thermal expansion of the film F at the time when the thermo-compression bonding process is completed. Accordingly, a deviation d1 observed from the visual field A and a deviation d2 observed from the visual field B are compared with each other, and if a difference between them is equal to or smaller than a predetermined value, the correction is not required. The term of the positional deviation means this difference value.

[Step 4]

If the positional deviation detected is equal to or lower than the permissible value, the correction of the positional deviation is not required. Therefore, the control circuit 205 (FIG. 17) makes a step advance to a step 7 from the step 4.

If the positional deviation detected is larger than the permissible value, the control circuit 205 makes step advances to a step 5 and a step 6.

[Step 5]

Figure 12:
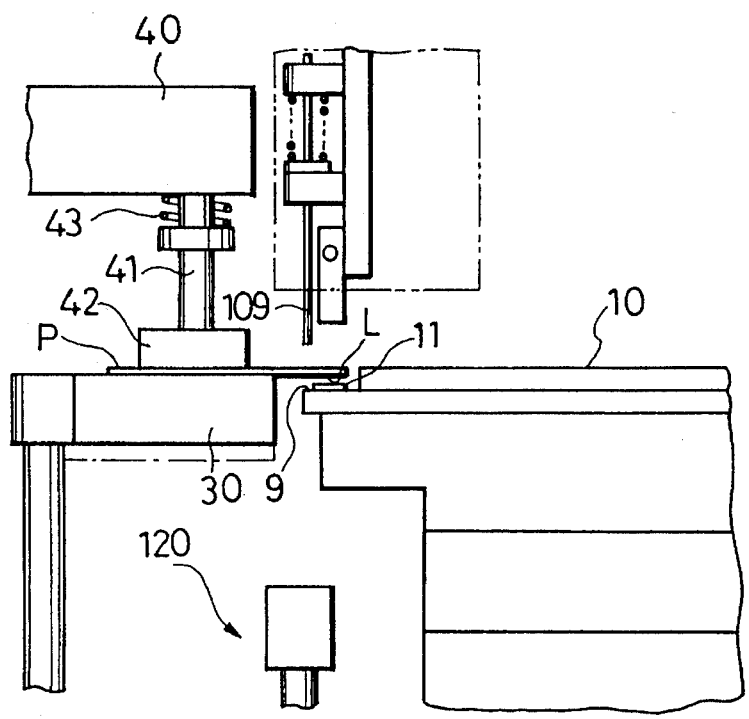
FIG. 12 is a side view showing a third stage of the bonding process in the outer-lead bonding apparatus shown in FIG. 1.

At a step 5 in FIG. 18, the control circuit 205 (FIG. 17) executes the raising of the table 30. That is, as shown in FIG. 12, the pressing member 109 is raised to thereby release the pressing state of the outer lead L. The table 30 is raised further, and thereby the TCP P is raised with the coil spring 43 being compressed. The outer lead L is thus removed from the anisotropic conductive tape 11. According to this lifting step of the TCP P by the table 30, removal of the outer lead L from the anisotropic conductive tape 11 is surely carried out. Besides, since this removal is carried out in a state that the TCP P is being sandwiched by the table 30 and the nozzle 42, there is no fear that another positional deviation may occur when the TCP P sucked by the nozzle 42 is pulled to the anisotropic conductive tape 11.

[Step 6]

At a step 6 in FIG. 18, the control circuit 205 (FIG. 17) executes the correction of the positional deviation. Positional deviations in the X- and Y-directions are corrected by driving the X-table 2 and the Y-table 3 to horizontally move the display panel 10. A positional deviation in the θ-direction is corrected by driving the θ-table 4 to horizontally rotate the display panel 10.

Apart from the above-mentioned procedure, the positional deviation may be corrected by moving the TCP P against the display panel 10. In such case, the nozzle 42 is further raised to thereby take off the TCP P from the table 30. Then, the loading head 40 is horizontally moved in the X- and/or Y-directions, or the nozzle shaft 41 is rotated by an angle of θ, thereby correcting the positional deviation in X-, Y- and θ-directions. That is, by relatively moving the TCP P in X-, Y- and θ-directions with respect to the display panel 10, the positional deviations in the X-, Y- and θ-directions are corrected.

[Step 7 and step 8]

Figure 13:
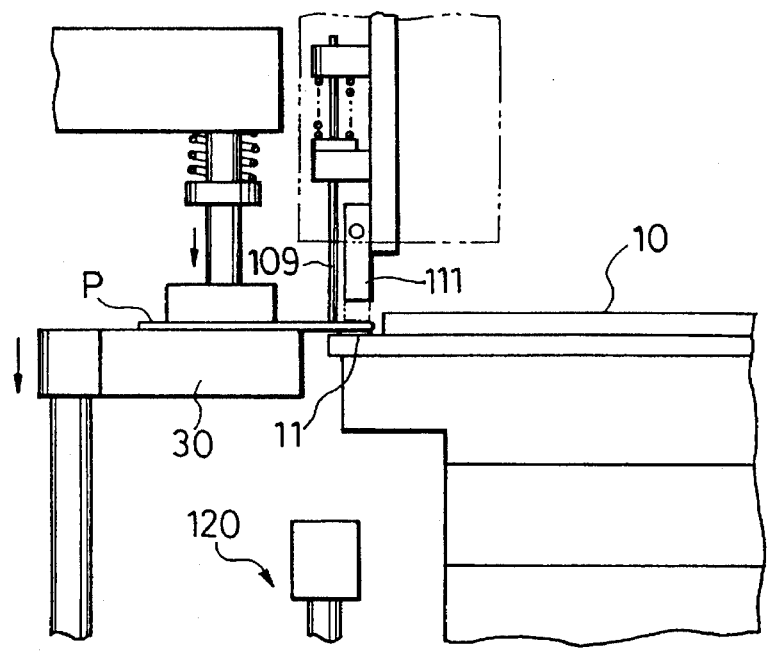
FIG. 13 is a side view showing a fourth stage of the bonding process in the outer-lead bonding apparatus shown in FIG. 1.

The control circuit 205 (FIG. 17) executes the lowering of the table 30 at a step 7 in FIG. 18 and executes the bonding at a step 8. As shown in FIG. 13, the table 30 is lowered. Further, the pressing member 109 is lowered to press the outer lead L onto the anisotropic conductive tape 11 provided on the electrode 9. After that, the thermo-compression bonding tool member 111 is lowered to carry out the thermo-compression bonding between the outer lead L and the electrode 9.

The thermo-compression bonding for one area unit is thus completed.

By repeating the above-mentioned steps, plural TCPs P are bonded one after another onto the electrode 9 which is provided at the longitudinal side part of the display panel 10. When the bonding is completed with respect to an entire length of the longitudinal side part, the θ-table 4 is driven to horizontally rotate the display panel 10 by 90°. Subsequently, the TCP P is bonded to a short side part of the display panel 10 in a similar way to the above. When the bonding of all TCPs P is completed for the display panel 10, the display panel 10 is removed from the table 5. After that, another display panel 10 is mounted, and the same operations described above are repeated.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

What is claimed is:

1. An outer-lead bonding method comprising the steps of:
   locating an outer lead of a tape carrier package above an electrode of a display panel;
   lowering a pressing member and slightly pressing said outer lead on said electrode to temporarily remove any warp of said outer lead;
   detecting a positional deviation between said outer lead and said electrode when said outer lead is being pressed onto said electrode by said pressing means;
   relatively moving said tape carrier package from said electrode to correct said positional deviation; and lowering a compression member and bonding said outer lead onto said electrode.

2. An outer-lead bonding method comprising the steps of:

taking up a tape carrier package having an outer lead with nozzle means;

locating said tape carrier package on table means disposed along a display panel;

holding said tape carrier package on said table means to sandwich said tape carrier package by said nozzle means and said table means;

detecting a positional deviation between said tape carrier package and said display panel;

relatively moving said tape carrier package from said display panel to correct said positional deviation; and lowering a compression member and bonding said tape carrier package onto said display panel.

3. An outer-lead bonding apparatus comprising:

holding means for holding thereon a substrate on which an electrode is formed;

nozzle means for feeding a tape carrier package to a position where an outer lead of said tape carrier package is to be disposed on said electrode;

pressing means for pressing an outer lead of said tape carrier package onto said electrode on the holding means to remove any warp of said outer lead;

bonding means for bonding said outer lead to said electrode on the holding means; and observation means for observing said electrode and said outer lead when said outer lead is being pressed onto said electrode by said pressing means, said observation means being disposed under a position where said outer lead is bonded to said electrode.

4. An outer-lead bonding apparatus in accordance with claim 3 wherein said electrode includes an anisotropic conductive tape stuck thereon.

5. An outer-lead bonding apparatus comprising:

holding means for holding thereon a substrate on which an electrode is formed;

nozzle means for sucking and feeding a tape carrier package to a position where an outer lead of said tape carrier package is to be disposed on said electrode on the holding means;

table means for putting thereon said tape carrier package;

lifting means for adjustably lifting said table means, the nozzle means being positionable so as to sandwich the tape carrier package between the table means and the nozzle means;

bonding means for bonding said outer lead to said electrode on the holding means; and observation means for observing said electrode on the holding means and said outer lead on the table means, said observation means being disposed under a position where said outer lead is bonded to said electrode.

6. An outer-lead bonding apparatus in accordance with claim 5 wherein said electrode includes an anisotropic conductive tape stuck thereon.

* * * * *